United States Patent [19]

Ma et al.

[11] Patent Number: 4,746,879
[45] Date of Patent: May 24, 1988

[54] DIGITALLY TEMPERATURE COMPENSATED VOLTAGE-CONTROLLED OSCILLATOR

[76] Inventors: John Y. Ma, 499 Dundee Ave., Milpitas, Calif. 90535; Steven Weiss, 4876 Caroine Way, San Jose, Calif. 95124

[21] Appl. No.: 901,439

[22] Filed: Aug. 28, 1986

[51] Int. Cl.$^4$ .......................... H03B 5/04; H03L 1/02
[52] U.S. Cl. ........................................ 331/44; 331/66; 331/116 FE; 331/176
[58] Field of Search ..................... 331/176, 66, 116 R, 331/116 FE, 158, 44

[56] References Cited

U.S. PATENT DOCUMENTS 4,633,422 12/1986 Brauer .............................. 331/176 X

FOREIGN PATENT DOCUMENTS 60-149223 6/1985 Japan ................................... 331/176
2064248 6/1981 United Kingdom ................. 331/176

OTHER PUBLICATIONS

Steel et al., Motorola Technical Disclosure Bulletin, vol. 1, No. 1, Aug. 1980, pp. 29–30.

Primary Examiner—Siegfried H. Grimm
Attorney, Agent, or Firm—Stephen G. Rudisill

[57] ABSTRACT

A digitally temperature compensated oscillator (TCO) system is provided which is capable of ascertaining and memorizing in an EEPROM-based look-up table, appropriate digital values of a temperature-compensating tuning voltage to the TCO during calibration. An on-board temperature sensing mechanism tracks variations in temperature in the TCO and produces an analog voltage value corresponding to the instantaneous temperature. The voltage value of the sensor output is digitized and designated to constitute an address into the EEPROM based look-up table. As the temperature changes, the digitized output of the temperature sensor and hence the address to the EEPROM changes accordingly. The TCO tuning voltage value corresponding to the address represented by the measured temperature is extracted from the values stored within the EEPROM table and then converted into a corresponding analog voltage which is used to drive the voltage-controlled oscillator (VCO) in order to maintain the output frequency of the TCO stabilized at a desired value.

The EEPROM contained within the TCO is preferably calibrated during production, under the control of a calibration and test circuit which regulates the calibration and testing of a TCO in a chamber whose temperature is ramped over a desired temperature range. The TCO includes an on-board microprocessor which allows integration of several of the TCO functions, including the analog-to-digital and the storage and retrieval of data to and from the EEPROM containing the look-up table and extremely simplifies the calibration and test procedure.

16 Claims, 7 Drawing Sheets

DIGITALLY TEMPERATURE COMPENSATED VOLTAGE-CONTROLLED OSCILLATOR

FIELD OF THE INVENTION

This invention generally relates to voltage-controlled oscillator circuits, such as those using piezoelectric crystals. More particularly, this invention relates to the digital control of a voltage-controlled oscillator in order to provide an oscillating frequency which is stabilized against temperature variations and other factors affecting the frequency.

BACKGROUND OF THE INVENTION

The use of piezoelectric crystals, such as quartz, as frequency standards constitutes an important application of piezoelectricity technically as well as commercially. A variety of piezoelectric crystal devices, such as crystal-based oscillator circuits, are commercially available and their use in the generation of precise frequency control and timing is extremely common and relies on the normally high quality factor of such piezoelectric crystals as mechanical resonators. Quartz crystals, for instance, serve as good frequency standards by virtue of their extremely high internal quality factor (i.e., the quality factor due to internal frictional losses, excluding mounting losses and air losses) which can attain a value of over $10^7$ at a frequency of around 1 MHz. In addition, quartz exhibits high quality as a dielectric along with a low dielectric constant and is relatively easy to be cut and polished.

Piezoelectric crystal oscillators are capable of generating a wide range of precise frequencies at a given temperature, but for a given oscillator substantial variations in the frequency of operation occur as the temperature to which the crystal is subjected varies over a relatively large range. Although the frequency versus temperature characteristics of piezoelectric crystals are determined primarily by the angles of cut of the crystal plates with respect to the crystallographic axes of quartz, and the points of zero temperature coefficient can be varied over a wide range by varying the angles of cut, the frequency of oscillation for any given angle of cut remains substantially temperature dependent.

To achieve higher stability of oscillating frequencies, oven-controlled oscillators, in which the crystal unit and the temperature-sensitive components of the oscillator are placed in a stable oven whose temperature is set to the crystal's turnover temperature, are used. Such oven-controlled oscillators are bulky and consume added power. In addition, an oven-controlled oscillator requires about 10 minutes after being turned on in order to stabilize. Significant frequency shifts are also produced because of thermal stresses in the crystal during warm up and this thermal-transient effect can make the typical warm up time of a crystal oscillator longer than the time it takes for the oven to stabilize.

Problems associated with a drift in oscillator frequency as the temperature of operation fluctuates substantially are also prevalent in other kinds of voltage-controlled oscillators and limits their use in frequency sensitive applications.

Some of the above problems have been solved, at least in part, by temperature-compensated crystal oscillators (TCXO's) which use to advantage the fact that in crystal oscillators, the crystal unit is offered a load capacity by the oscillator circuit and the oscillator operates at the frequency where the crystal unit's reactance cancels the reactance of a load capacitor. The oscillator frequency is dependent upon the load capacitance of the oscillator circuit, and TCXO's function by compensating the frequency versus temperature behavior of the crystal by varying the load capacitance appropriately. Generally, the output signal from a temperature sensor in the form of a thermistor network is used to generate the correction voltage applied to a varactor in order to maintain frequency stability. Such TCXO's are capable of providing high frequency stability over a reasonable temperature range, are smaller and consume less power than oven-controlled oscillators, and require no lengthy warm up time. Conventional TCXO's generally use some sort of trimmed nonlinear analogue networks which generate control voltages for the crystal oscillator on the basis of input from a temperature sensor, and require complex measurement and trim algorithms in the presence of multiple nonlinearities and scale factors. In addition, analog trimming has a limited range and entails the use of expensive and cumbersome hardware.

A further factor affecting the stability of the frequency of a crystal unit is the gradual change brought about as a result of crystal aging. Aging can result from a variety of causes such as mass transfer to or from the resonator's surfaces due to adsorption and desorption of contamination, and stress relief within the mounting structure or at the interface between the quartz crystal and the electrodes contacting the crystal. Although crystal aging observed at constant temperature usually follows an approximately logarithmic dependence on time and aging rate decreases as time elapses so that stabilization occurs within the unit each time the temperature of a crystal changes substantially, a new aging cycle starts and is accompanied by a corresponding frequency instability.

Crystals capable of increased frequency stability in the presence of temperature fluctuation and aging effects are available for frequency-sensitive operations but involve considerably increased cost due to the need for clean glass, metal or ceramic enclosures and advanced surface cleaning, packaging and ultra high vacuum fabrication techniques. The increased cost and accompanying bulk of such crystals constitutes a severe limitation to their use in most commercial applications requiring high frequency stability. Some currently available TCXO's do provide a relatively precise output frequency (variation of about ±5 ppm) over a limited temperature range, but these TCXO's use high-precision crystals which are costly because of the highly precise angle of cut and elaborate packaging.

The use of crystal oscillators as reference modules in cellular telephones in particular requires them to be extremely compact in order to keep the size of the phones as small as possible. In addition, this application requires a high degree of frequency stability in order to keep the operation of the cellular phones in conformance with strict FCC requirements. As a result, conventional crystal oscillator-based cellular phones have to be serviced at least once a year to adjust the oscillator unit to account for any frequency instability due to crystal aging.

Hence, there exists a need for a temperature-compensated oscillator which is capable of producing a stable output frequency over a wide range of temperature, which can easily be compensated for the effects of frequency drifts due to other factors, such as crystal aging in TCXO's, and which can be fabricated in the form of an economical and compact unit.

SUMMARY OF THE INVENTION

Accordingly, it is a primary object of this invention to provide a temperature-compensated oscillator (TCO) which has increased frequency stability and yet does not require a high quality, high cost crystal unit.

A related object of this invention is to provide a TCO which does not have to be calibrated on site.

A further object of this invention is to provide a TCO of the above kind which operates under low power and low current drain conditions.

Another object of this invention is to provide the above TCO with increased frequency stability over an increased range of temperatures.

Yet another object of this invention is to provide a TCO system which provides convenient calibration as well as extensive self-test capabilities and which eliminates the need for mechanical trimming in order to maintain a stabilized oscillator frequency.

These and other objects of this invention are realized by providing a digital TCO system which is capable of ascertaining and memorizing, e.g., by storing them in an EEPROM-based look-up table, appropriate digital values of a temperature-compensating tuning voltage to the TCO during calibration. An on-board temperature sensing mechanism tracks variations in temperature in the TCO and produces an analog voltage value corresponding to the instantaneous temperature. The voltage value of the sensor output is digitized and designated to constitute an address into the EEPROM based look-up table.

As the temperature changes, the digitized output of the temperature sensor and hence the address to the EEPROM changes accordingly. The TCO tuning voltage value corresponding to the address representing the measured temperature is extracted from the values stored within the EEPROM table and then converted into a corresponding analog voltage which is used to drive a voltage controlled oscillator (VCO) in order to maintain the output frequency of the TCO stabilized at a desired value.

The EEPROM contained within the TCO is calibrated with the aid of a special calibration/test unit during production, in conjunction with a TCO test system which tracks the calibration and testing of a plurality of TCO's simultaneously, via individual calibration/test units, in a chamber whose temperature is ramped over a desired temperature range. The TCO test system is computer-based and the TCO itself includes an on-board microprocessor which allows integration of most of the TCO functions, including the analog-to-digital and digital-to-analog conversion, as well as the storage and retrieval of data to and from the EEPROM containing the look-up table. The TCO test system monitors the cycling of the temperature within the chamber over a plurality of temperature levels, while the calibration/test unit tracks the corresponding frequency changes of the TCO in order to give the TCO the information it requires to obtain an optimum compensating voltage value for each temperature level in order to form the look-up table. The microprocessor of the TCO controls access to the EEPROM table for generating the proper tuning voltage to be fed to the TCO on the basis of input from the on-board temperature sensor. In addition, the TCO microprocessor modifies the EEPROM-based look-up table if required in order to fill any gaps in the table generated during the calibration process; the gaps can be filled on the basis of pre-defined interpolation or curve-fitting algorithms.

The system of this invention is efficient and applicable to most TCO applications because each point on the temperature versus frequency curve can be independently trimmed and verified. In addition, the trim algorithm is simple and non-interactive, and the trimming itself is inexpensive as it involves just the programming of the EEPROM on the basis of test values generated as part of the calibration process.

BRIEF DESCRIPTION OF THE DRAWINGS

The invention and other objects and advantages thereof, may best be understood by referring to the following description along with the accompanying drawings in which.

DESCRIPTION OF THE PREFERRED EMBODIMENT

While the invention will be described in connection with certain preferred embodiments, it will be understood that it is not intended to limit the invention to those particular embodiments. On the contrary, it is intended to cover all alternatives, modifications and equivalent arrangements as may be included within the scope of the invention as defined by the appended claims.

In particular, it will be noted that while the system of this invention has been described with reference to digital frequency compensation and control of a crystal-based voltage-controlled oscillator, it can be used effectively with most types of oscillators wherein a tuning voltage controls the frequency of oscillations.

Figure 1:
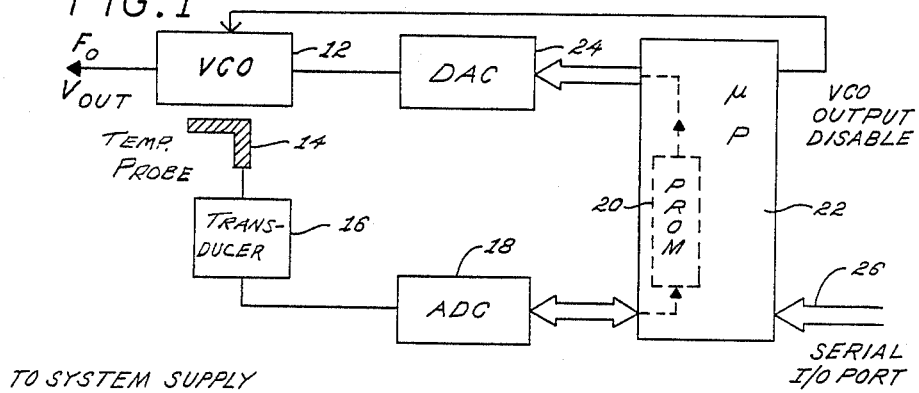
FIG. 1 is a block diagram illustrating the basic functioning of a temperature-compensated voltage-controlled oscillator system according to this invention.

Referring now to the drawings and specifically to FIG. 1, there is shown an exemplary TCO system embodying the present invention. The TCO system 10 essentially comprises a voltage-controlled oscillator (VCO) 12 which, by way of illustration and not as a limitation, is a voltage-controlled crystal oscillator (VCXO) generating an output frequency $F_o$. A temperature sensing probe 14 tracks the instantaneous ambient temperature within the VCXO and in conjunction with a transducer 16 produces a corresponding analog electrical output. The analog signal generated by the temperature transducer 16 is converted to a digital signal by an analog-to-digital converter (ADC) 18 which in turn is in communication with an electrically erasable and programmable read only memory (EEPROM) 22. The EEPROM is preferably based within a conventional CMOS microprocessor 20.

According to a significant feature of this invention, the EEPROM 20 has stored within it a series of digital values of the temperature-compensating tuning voltage for the VCXO 12 in the form of a look-up table. Each digital value stored in the look-up table corresponds to a specific temperature value within the overall range of temperature fluctuation which the VCXO 12 is expected to encounter in its area of application. For any given temperature value within the specified temperature range of operation of the crystal oscillator, the corresponding digital value stored in the look-up table represents the temperature-compensating tuning voltage required to be fed to the VCXO in order to neutralize any frequency drift at its output at that temperature and hence maintain the output frequency at a desired constant level.

The system of this invention functions by using the digitized output of the ADC 18 as an address or index into the look-up table in order to retrieve the corresponding temperature-compensating tuning voltage value stored therein. Subsequently, the retrieved tuning voltage value is fed to a digital-to-analog converter (DAC) 24 for translating the stored digital value into a corresponding analog signal which is then fed to the VCXO 12 to maintain its output frequency at the desired set point. The ADC, the DAC and, if possible, the temperature sensor are preferably based with the microprocessor of the TCO system.

The provision of the microprocessor 22 as part of the TCO system makes the TCO versatile by providing it with a variety of capabilities such as self-testing and self-calibration which will be described in detail below. A major advantage of this system is that the generation of the temperature-compensating tuning voltage for the crystal oscillator can be performed on an almost instantaneous basis since the output frequency of the oscillator need not be monitored as the temperature changes. Instead, each time the temperature of the crystal oscillator changes, the corresponding tuning voltage value required to keep the output frequency at the desired constant value is readily available within the look-up table and can be extracted therefrom and fed to the VCXO in order to stabilize the output frequency.

In addition, the use of the microprocessor permits further control over the temperature compensation process by allowing the EEPROM-based look-up table values to be offset or modified on the basis of aging control data input via serial port 26 in order to account for further fluctuations in the output frequency as aging of the crystal unit progresses. The microprocessor 22 can also be used as part of a system for externally monitoring the output frequency of the oscillator and comparing it with a predefined set point value in order to correct, if possible, the oscillator output or at least prevent generation of an output from the crystal oscillator if the output frequency is found to drift beyond an allowable range of fluctuation in order to prevent system errors arising due to a destabilized output frequency.

Figure 2:
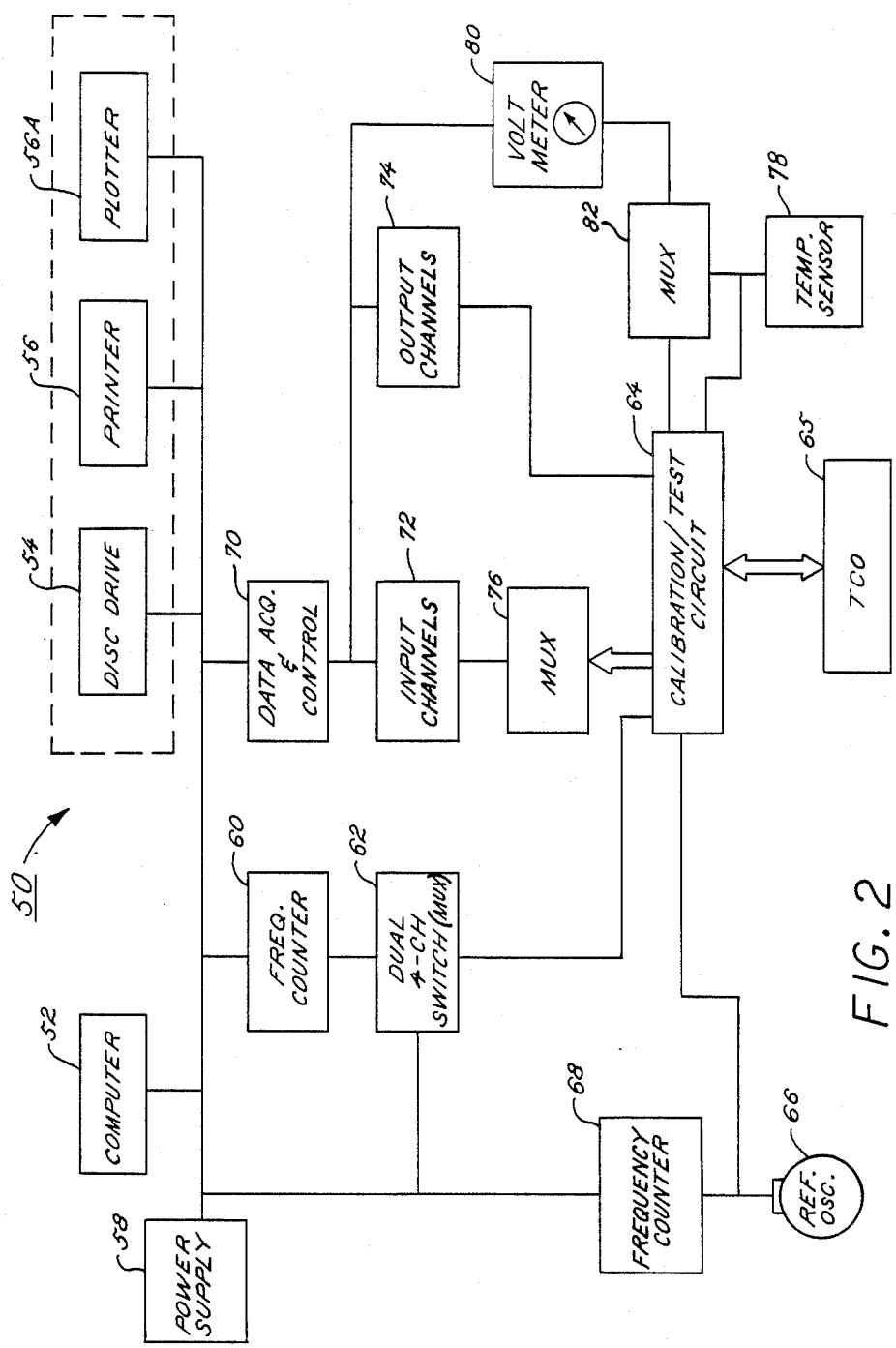
FIG. 2 is a simplified block diagram of a computer-controlled test system for calibrating and testing temperature-compensated oscillators for use according to the illustrative oscillator system of FIG. 1.

Referring now to FIG. 2, there is shown a block diagram of an overall computer-controlled test system 50 for testing and calibrating temperature-compensated voltage-controlled oscillators so that they may be used according to the system illustrated in FIG. 1. The test system 50 essentially comprises a computer unit 52 interfaced to any required peripheral devices such as a disk drive 54, a printer 56 and a plotter 56A. Power to the various circuits and components under test is supplied through a regulated power supply 58. A frequency counter 60 is provided in conjunction with a dual 4-channel switch 62 for multiplexing up to eight individual voltage-controlled oscillators, such as the temperature-compensated crystal oscillator described above, and measuring the output frequency of each one through a calibration and test circuit (CTC) 64 whose functional details will be described below.

The test system also includes a reference oscillator 66 and an associated frequency counter 68. The reference oscillator 66 provides a stabilized output frequency which serves as a reference with which the CTC 64 compares the output frequency of the crystal oscillator in order to ascertain and correct its stability, as will be described below. The frequency counter 68 serves as a secondary basis for ensuring that the reference oscillator provides an output pulsating at the desired reference frequency.

The system 50 has a data acquisition and control unit 70 which regulates the exchange of relevant data between the temperature-compensated oscillator, the CTC 64 and the computer 52 through input channels 72 which may comprise a plurality of conventional data input cards, and output channels 74 similarly comprising a single or a plurality of conventional data output cards. Input of data to the input channel 72 is controlled through a multiplexer 76. The computer test system is provided with a highly accurate temperature sensor 78 which serves as an absolute temperature test reference for test data and helps to properly initiate calibration sequences. A conventional 5½ digit voltmeter 80 is provided and is capable of reading, through a multiplexer 82, the output of the temperature sensor 80 as well as any voltage outputs of the CTC 64 before feeding it to the data acquisition and control unit for further processing. The multiplexers 76 and 82 permit simultaneous testing and calibration of a plurality of TCO's. In addition, the multiplexer 82 allows multiple inputs from a set of TCO sensors and calibration/test circuits to the system voltmeter 80.

Figure 3:
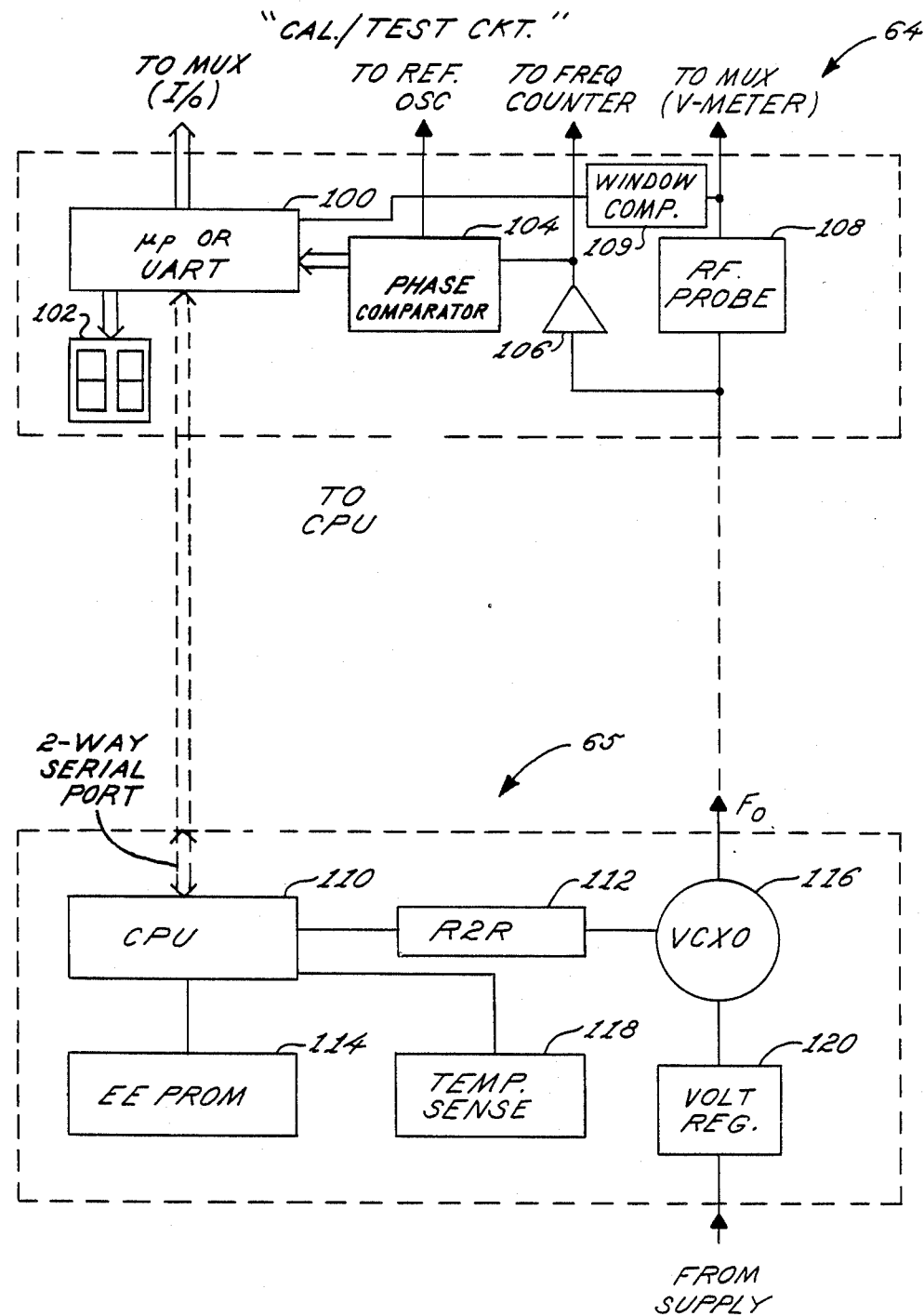
FIG. 3 is a block diagram of illustrative calibration/test circuitry and TCO circuitry for use with the system of FIG. 2.

Referring now to FIG. 3, there is shown a more detailed diagram of the calibration and test circuit (CTC) and the temperature-compensated crystal oscillator of FIG. 2. The CTC 64 includes a device for interfacing with the serial port of the microprocessor on board the TCO. This can take the form of a microprocessor or a conventional universal asynchronous receiver transmitter (UART) 100 which provides the required serial-to-parallel (or vice versa) conversion of data exchanged with the TCO 65 of FIG. 2. If a microprocessor is used in place of the UART, it also serves as a stand-alone computerized test controller as well as calibrator. A 2-digit digital display 102 is connected to the parallel output of the microprocessor or UART and provides a visual indication of, among other parameters, the results of a particular calibration sequence. For instance, the TCO test system may be programmed to use the display associated with the UART to provide an "OK" signal or an appropriate error message when the unit is self-calibrating under controlled temperature-variation sequences. A digital phase comparator 104 provides the CTC and the TCO with feedback information on the phase and frequency of the TCO output relative to the reference frequency provided by the reference oscillator of FIG. 2. The test circuit includes an RF buffer 106 in the form of a high input impedance amplifier which functions as a high input impedance and low output impedance link to drive the relatively high capacitance 50Ω line to the dual-switch multiplexing arrangement 62 of the system frequency counter 60 (FIG. 2). The CTC also includes an RF probe 108 having a high impedance and connected to the voltmeter 80 (FIG. 2) through the associated multiplexer 82 without causing excessive loading.

The arrangement using the digital phase comparator 104 constitutes an important part of the test circuit as it provides the necessary feedback for self-calibration of the TCO on the basis of the frequency reference provided by the reference oscillator. The feedback provided by the phase comparator 104 allows the TCO to read the measured phase angle between its output and that of the reference oscillator, analyze any phase change therein and convert it to a frequency difference, and then choose a compensating tuning voltage value for the TCO that results in the least frequency error or phase drift. The TCO system in conjunction with microprocessors on board the TCO and the CTC subsequently programs the corresponding compensating value into the EEPROM-based look-up table within the TCO.

Referring in particular to the TCO 65, it essentially comprises a CPU unit 110 which preferably includes a built in analog-to-digital converter (not shown). The CPU 110 is interfaced with the microprocessor or UART 100 of the CTC 64, and in addition regulates the operation and monitors the status of the digital phase comparator 104. An external digital-to-analog converter (DAC) in the form of a conventional R-2R network 112 is also provided.

An EEPROM 114 is provided external to the CPU but in communication with it in order to store appropriate values of the temperature-compensating voltage during the calibration procedure before retrieving the correct compensating voltage during actual use. Once the stored value within the EEPROM 114 is retrieved, it is converted to an analog format by the R-2R network 112, and the resulting analog signal is fed as the frequency-compensating tuning voltage to the voltage controlled crystal oscillator 116 of the TCO system 65. The resulting RF output voltage from the VCXO 116 is read by the voltmeter 80 of the TCO test system (FIG. 2) through the high impedance RF probe 108 of the CTC. This RF output voltage is buffered and amplified by the buffer amplifier 106 of the CTC and converted to a digital low-impedance output suitable for transmission over a 50Ω line to the test system frequency counter and for use by the digital phase comparator 104. Furthermore, in production, where the CTC functions as a stand-alone test controller/calibrator, the output from RF probe 108 is fed to window comparator 109, which indicates to the microprocessor 100 whether or not the RF output voltage is within specified amplitude limits. A measure of the ambient temperature in the vicinity of the TCO at a given sampling time is provided by a temperature sensor 118. All components forming the TCO 65 are supplied with electrical power by either a voltage regulator 120 which in turn is fed by the system power supply 58 of FIG. 2, or directly by the system power supply itself.

The basic sequence of operations which the CTC system comprising the TCO and the CTC undertakes as part of a typical TCO calibration and testing sequence involves the placement of a batch of TCO's into a temperature-controlled oven with each TCO being interfaced to separate a CTC according to the basic scheme of FIG. 2. Each CTC can also be connected to the data acquisition and control system 70 (FIG. 2) if performance data is to be tracked. The temperature of the oven is then linearly ramped, by a programmable process controller regulating the oven, through the desired temperature range over which frequency stability is required, starting at the lowest temperature point and slowly moving across the range to the highest temperature point. At each temperature point, as determined by the digitized TCO temperature sensor output and for each TCO, the CTC, using its microprocessor in conjunction mainly with the microprocessor on board the TCO monitors the output frequency of the TCO through its digital phase comparator.

Any error in frequency is compensated by regulating the tuning voltage supplied to the voltage-controlled crystal oscillator circuit (VCXO) of the TCO and tracking the corresponding frequency change in order to determine an optimum tuning voltage which maintains the output frequency either at an exact desired set-point or within a predefined range of allowable deviation. Subsequently, the compensating optimum tuning voltage value is directly stored or "burned" by the test system into the EEPROM of the TCO at the address corresponding to the temperature at which the measurement was made. A similar sequence is adopted at each of the temperature points within the overall temperature range so that at the end of the calibration process the EEPROM for a given TCO has stored within it a table of digitized compensating values to be fed to the DAC of the TCO. The compensating values constitute the data stored within such a look-up table whereas the address of the table is provided by the corresponding digitized value of the temperature sensor output voltage. At each discrete temperature point designated by the varying output of the ADC, there exists stored within the EEPROM a compensating voltage value that is optimized for that corresponding temperature point.

It will be noted that each of the temperature steps, as the oven temperature is being ramped, can be considered to be a small range in itself and the ADC, working upon the output of the temperature sensor, changes its output as the sensor output shifts from one range to another and provides a flickering value during the moments of transition. To ensure stable measurements for any given range, the test system takes measurements of the best compensating voltage both at the time when the sensor output has shifted into a particular range as well as when the sensor output has shifted out of that range. The average of these two measurements is then chosen to represent the optimal compensating tuning voltage value for the discrete temperature point representing the range over which the two measurements are made. This procedure requires a plurality of tuning voltage values to be tried out on the VCXO and the output frequency resulting from each of these values to be monitored in order to determine the optimal tuning voltage value for any temperature point. This complex monitoring and recording process is made extremely convenient because of the microprocessor provided on board each of the TCO's and the associated CTC's.

Figure 4:
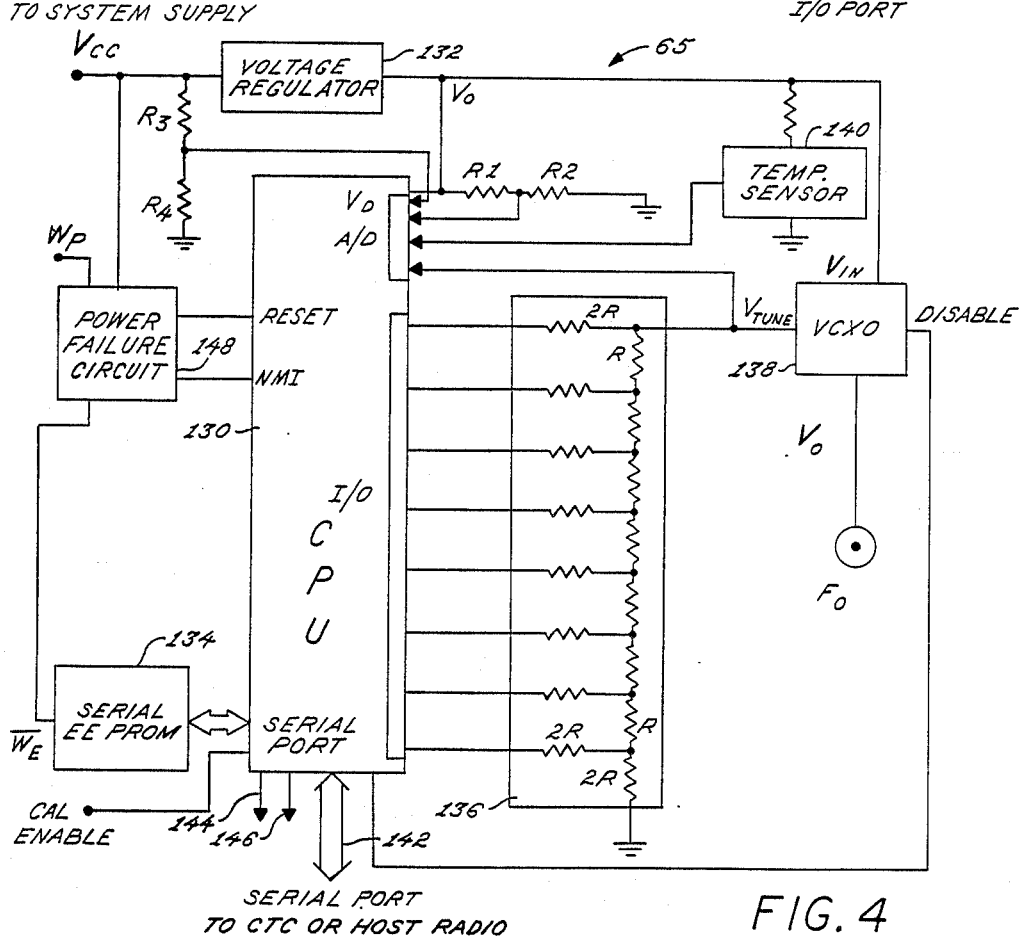
FIG. 4 is a more detailed schematic diagram of an exemplary temperature-compensated oscillator according to this invention illustrating its main components.

Referring now to FIG. 4, there is shown a more detailed schematic diagram of the preferred embodiment of a TCO according to this invention. As shown, the TCO essentially comprises a central processing unit (CPU) 130 which is powered by a voltage regulator 132 connected to the main system supply of FIG. 2. The output voltage $V_O$ from the voltage regulator 132 is provided to the supply point $V_D$ of the CPU 130 and also to one of a series of analog-to-digital conversion points which form part of the ADC built into the central processing unit. This supply voltage $V_O$ is applied through a voltage divider comprising resistors $R_1$ and $R_2$ and constitutes a ratiometric input to the ADC which provides a voltage reading which effectively is a percentage value relative to the voltage at the supply point $V_D$ of this CPU. The system supply voltage $V_{cc}$ is also applied to one of the analog-to-digital conversion input points through a voltage divider comprising resistors $R_3$ and $R_4$, and constitutes a ratiometric input to the ADC which provides a voltage reading which effectively is a percentage value relative to the voltage at the supply point $V_{cc}$ for the voltage regulator $V_{32}$. During normal operation, as well as during the actual calibration process, the voltage provided by the system supply is regulated and hence the ADC input provided by $R_3$ and $R_4$ can be used as a reference to compare and test the output voltage $V_O$ of the voltage regulator 132 as part of the self-testing of the TCO.

In the illustrative embodiment of FIG. 4, the TCO 65 is provided with an EEPROM 134 which is located externally to the CPU 130 and placed in communication with the CPU through its input/output channel lines. The DAC for the TCO is in the form of the R-2R network 136 which is also connected to the CPU through its input/output channel lines. The output of the R-2R network 136 is fed to the main voltage-controlled crystal oscillator (VCXO) 138 for the TCO 65 and serves as the controlling voltage for adjusting the output frequency of the VCXO 138. The VCXO is supplied with electrical power by the regulated output of the voltage regulator 132, as well as by the system supply voltage $V_{cc}$.

The R-2R network 130 of the TCO does not require the amplification stage conventionally associated with it because the tuning voltage input of the VCXO 138 has a high impedance inherent to the oscillator circuit itself as will be described in detail below. Because the resulting current drain is low, the output of the R-2R network can directly serve as the frequency-compensating tuning voltage to the VCXO. The R-2R network is provided with a pull-up resistor in order to attenuate or limit the range of output voltage of the digital-to-analog converter 136 to the linear portion of the TCO tuning range. The effective resolution of the DAC is virtually doubled by further splitting the maximum output voltage range of the R-2R network, as will be described in detail below.

The temperature monitoring capability of the TCO 65 is provided by a temperature sensor 140 which is also powered by the voltage regulator 132 and produces an analog output voltage corresponding to the temperature being sensed at a given instant. The analog output of the temperature sensor 140 is fed, after passing it through suitable scaling and offset amplifiers (not shown), to one of the inputs of the analog-to-digital converter provided on-board the CPU 130 for the TCO in order to digitize it for further processing.

The basic sequence of operations that the TCO 65 undergoes begins with the temperature sensor 140 identifying the ambient temperature of the VCXO 138 and transducing it into an electrical voltage which is scaled and offset to match the input voltage range of the ADC on board the CPU 130, as will be described in detail below. The resulting voltage is then converted into its corresponding digital value by the ADC. It will be noted that the EEPROM 134 at this stage has stored within it the look-up table of temperature-compensating voltage values corresponding to discrete temperature values spanning the expected temperature fluctuation range for the TCO, as part of the calibration and testing process. The CPU 130, during actual on-site usage, uses the digitized output of the temperature sensor as an address or index into the look-up table stored within the EEPROM 134 and extracts the corresponding value of the temperature-compensating voltage required to maintain the output frequency of the VCXO 138 at a desired set point. Subsequently, the extracted voltage value, which is in a digital format, is fed to the DAC represented by the R-2R network 136 which, in conjunction with the DAC range selection arrangement, converts it into a corresponding analog signal which can be used to control the output frequency of the VCXO.

The central processing unit 130 includes a serial port 142 that allows the TCO to communicate with the computer test system in general and the CTC in particular, as well as with a host radio or other external devices. In FIG. 4, the analog output voltage generated by the DAC 136 is also fed back to one of the inputs of the ADC on board the CPU 130. This connection and the connections of the voltage regulator output $V_O$ and the system supply voltage $V_{cc}$ to the on-board ADC, serve as self-test channels for the TCO since the CPU can use them to perform further comparisons to ensure their accuracy and stability; this feature constitutes one of the many advantages of providing a central processing unit on board the TCO system.

The CPU 130 is also provided with a self-test line 144 which is adapted to flag the success or failure of a pre-programmed self-test procedure each time the TCO system is initially powered. The self-test procedure generally includes tests to determine whether or not the CPU, the EEPROM, the on-board ADC as well as the R-2R network constituting the DAC are functioning properly. The test sequence can also include a preliminary check of the EEPROM to ensure that all designated values within the EEPROM-based look-up table have been properly stored within the EEPROM as part of the calibration procedure. For instance, the EEPROM can be tested on the basis of a checksum test involving the addition of all data stored within the look-up table and comparing it to a pre-designated checksum. The test sequencing can further include tests, via the on-board ADC, of the voltage regulator output as compared to the normally regulated system supply voltage $V_{cc}$. In addition, the CPU function itself can be tested; by implication if the CPU is capable of actually performing the test and by specific tests designed to test CPU function. The provision of this self-test pin provides the TCO system with a basic self-test capability even if the complexity of the serial port is dispensed with, since it permits simplified self-testing by checking the output status of just one pin without having to go through a complicated serial protocol.

The central processing unit 130 of the TCO 65 is also provided with at least one control or "handshake" line 146 which, although technically a part of the serial port, specifically provides for bi-directional control or exchange of messages with the computer test system or with an external device such as a host radio or pager within which the illustrative temperature-compensated oscillator is to be used. Since the handshake line 146 constitutes a bi-directional bus, it permits exchange of signals between the TCO and external devices by selectively controlling the direction in which messages are transmitted or received, on the basis of conventional handshaking protocol which includes interdevice signaling indicating when one device is ready to transmit a particular message and a corresponding acknowledgment from the device for which the message is intended that it is in a ready state to receive the message.

The TCO is provided with a "power failure" circuit 148 which detects any drop in input voltage below a predefined minimum value and accordingly regulates a series of control lines linking it to the CPU 130 and the EEPROM 134 of the TCO. The power failure circuit gates a write protect input $W_p$ which enables or disables writing of data into the EEPROM 134 through a write enable line $W_e$ during initial calibration or subsequently during aging offset correction. The $W_p$ input is gated by the power fail circuit in such a way as to disable the writing of data into the EEPROM under low voltage conditions. The status of $W_p$ is controlled by the calibration and test system or the host radio.

The power failure circuit 148 also gates a reset line to the microprocessor of the TCO which is held active after power-on or after a return to normal voltage following occurrence of low voltage conditions, for a period of time sufficiently long to ensure proper reset of the microprocessor. The circuit 148 controls a non-maskable interrupt (NMI) input which is pulled active whenever a power failure is detected in order to interrupt the microprocessor so that appropriate measures, such as disabling the VCXO output, setting the self-test pin to the "fail" state, and aborting any aging offset correction, may be taken.

The CPU 130 of the TCO also has a separate calibration enable (CAL ENABLE) input line for use during the initial calibration sequence. When the CAL ENABLE line is pulled active, while the write protect input $W_p$ is also active, the microprocessor begins storing data representing the optimum compensating tuning voltage value into the EEPROM. Providing the CAL ENABLE function on a separate line instead of as a serial port command provides certain advantages: (i) it prevents a false command on the serial port from destroying the EEPROM data table, and (ii) modification of the EEPROM data table, once the TCO is connected into a host radio, can be easily prevented by hard-wiring the CAL ENABLE to be inactive. The CPU 130 of the TCO has a DISABLE line connected to the VCXO which allows the CPU to shut off the VCXO output during power failure conditions or during the TCO stabilization time following power-up. The DISABLE may also be activated through the CPU by an externally generated command if the VCXO output frequency is found to be out of specified limits even after attempts at aging offset correction.

If the EEPROM within the TCO has excessive current drain, a transistor switch (not shown) can be connected to the EEPROM and controlled by the TCO microprocessor to gate the power or control line to the EEPROM in such a manner as to keep the EEPROM turned on only when it is being used.

In addition to providing the various calibration, self-testing and system control functions, the provision of the central processing unit on board the TCO system brings about a significant reduction in components used as part of the TCO system. More specifically, the central processing unit makes possible the use of a serial EEPROM instead of a conventionally used parallel bipolar EEPROM or PROM, thereby bringing about a reduction from a 20-pin parallel EEPROM or PROM IC package to an 8-pin serial EEPROM IC. The CPU also dispenses with the need for discrete digital-to-analog converters and analog-to-digital converters which are typically 18 or 20-pin IC's, since the on-board microprocessor provides most of these functions within a conventional single package IC. In effect, although the illustrative embodiment employs a microprocessor in addition to the rest of the TCO circuitry the overall system is in fact simplified and made more compact and economical by having all possible capabilities built into the processing system. This ultimately results in a greatly optimized form factor for devices in which the crystal oscillator system is used.

In addition, the use of a microprocessor permits the use of an EEPROM having significantly reduced storage capacity since there may be no need to measure and record all required values of the temperature-compensating voltage corresponding to all designated temperature values as part of the calibration procedure. Instead, readings may be taken only at preselected temperature values and the values of the temperature-compensating voltage corresponding to the remaining temperature values can be obtained by using the central processing unit of the microprocessor to interpolate between the read values. The microprocessor also brings about further reduction in storage requirements by allowing the use of data compression and expansion techniques.

The use of a serial EEPROM, made possible by use of the on-board microprocessor, provides another advantage in that it results in a significantly lower current drain on the TCO circuit as compared to a parallel bipolar PROM. In addition, it makes possible the remote monitoring of an output frequency derived from the TCO, through a base station tracking the output of the host radio containing the TCO, identification of any frequency drift with respect to a predefined set point, and the subsequent transmission to the CPU of instructions indicating that an appropriate offset value be stored in the EEPROM and be added to the values extracted from the EEPROM look-up table in order to retain stability over the output frequency of the oscillator. This type of offset adjustment or trimming is of particular use in preventing the problems generally arising out of frequency drifts due to normal aging of the crystal unit used within the TCO. The microprocessor also serves as a simple and convenient means for disabling the output of the VCXO whenever constant remote monitoring of the output frequency reveals a frequency drift beyond a pre-defined allowable range without resorting to additional tracking and delay circuitry. This disabling feature is of particular use in preventing problems arising due to the stabilization time of the TCO each time the TCO system is powered on and goes through a warm-up cycle. The VCO can be disabled for a length of time sufficient to allow stabilization (e.g., for 10 seconds) following power-up of the TCO.

Figure 5:
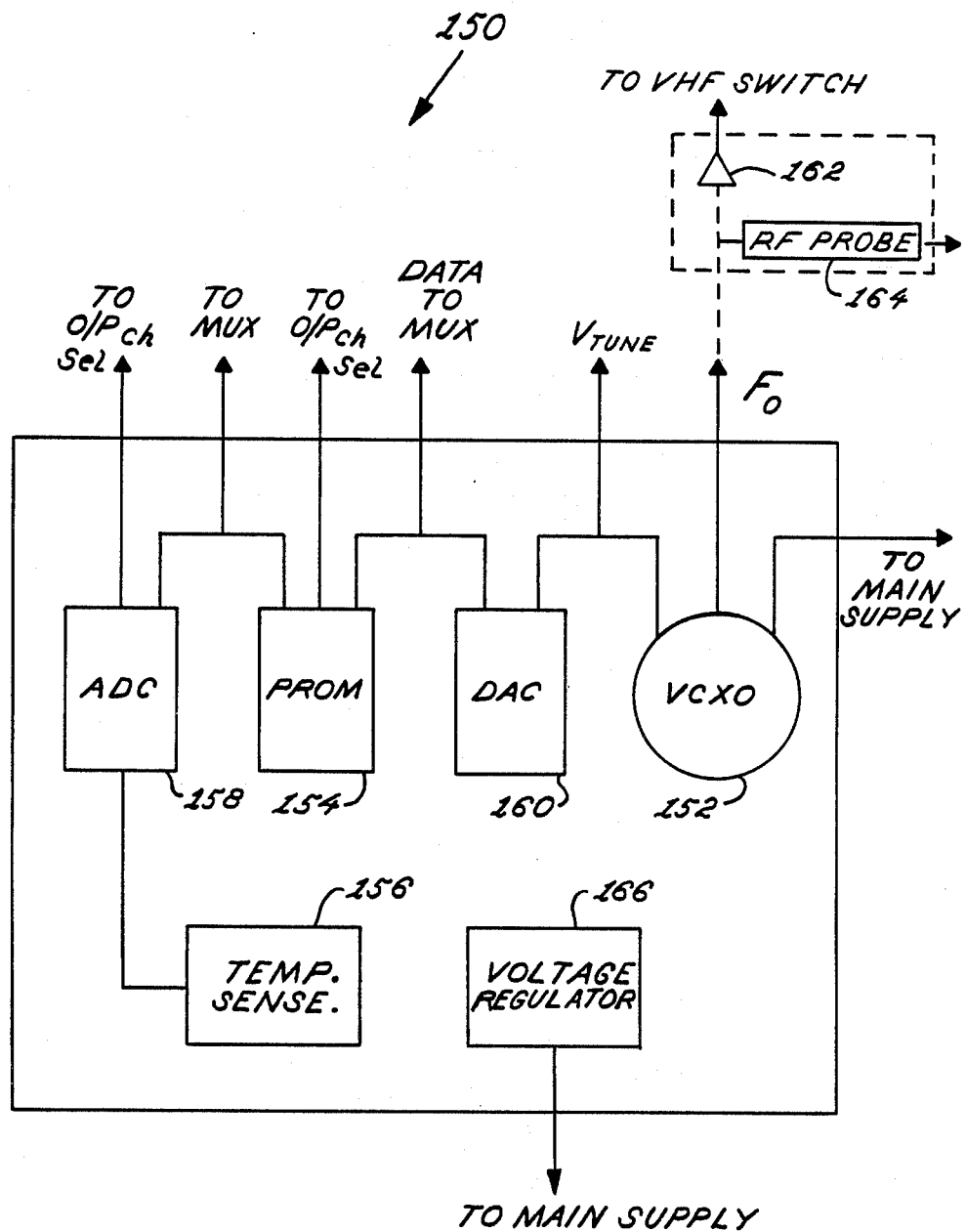
FIG. 5 is a schematic diagram of an alternative embodiment of a TCO which does not have an on-board microprocessor.

Referring now to FIG. 5, there is shown an alternative embodiment of a temperature-compensated crystal oscillator 150 for use with the system of this invention as outlined in FIGS. 1 and 2. The TCO 150, which, unlike the embodiment of FIG. 4, is not microprocessor based, essentially comprises a voltage controlled crystal oscillator 152 which is powered by the main supply for the overall system and generates an output pulsating at a frequency $F_o$. The TCO includes a PROM 154, preferably an EEPROM, which contains the look-up table of appropriate compensating values of the controlled voltage for the VCXO. A temperature sensor 156 is provided which in conjunction with a suitable transducer (not shown) provides an analog electrical output form representative of the instantaneous ambient temperature of the TCO. The analog output of the temperature sensor is converted into a corresponding digital value by an ADC 158 whose control line is fed to the output channel of the computerized test system of FIG. 2 in order to allow the ADC output to be shut off when the test system has to access the address inputs of the PROM.

The digitized output of the ADC 158 is connected directly to the address inputs of the PROM so that the instantaneous digitized value of the temperature-sensor output can be used as an address or index into the PROM-based look-up table. The computerized test system is also connected to the ADC output/PROM input lines to receive an external indication of the ADC output and to control the PROM address inputs for programming and testing the PROM.

In normal use, the compensating value stored in the PROM at the address given by the ADC output which represents the instantaneous temperature is output by the PROM to a DAC 160, which converts it to an analog voltage that controls the output frequency of the VCXO.

The computerized test system is connected to the lines connecting the PROM output to the DAC input, via multiplexers, to allow multiple TCXO's to be tested and calibrated. This type of test system connection gives an external indication of the values stored in the PROM and allows, in certain cases, programming of the PROM while in-circuit.

Depending on whether it is bipolar or erasable, the PROM may be programmed out-of-circuit in a PROM programmer or in-circuit using the test system and multiplexers. In the former case, during testing and calibrating the test system the test system would have to feed trial-compensating values to the DAC and store the optimal values for later programming into the PROM. In the latter case, the test system would have to feed values to the DAC only during calibration. Once the optimal compensating values are programmed into the in-circuit PROM, the PROM itself can be selected by means of its control lines to directly feed the DAC from its look-up table the instantaneous compensating value at the address given by the ADC output. The PROM control lines, driven by the test system output channels, serve to select either low-impedance output drive from the PROM or high-impedance output shut-off to allow the test system to feed values to the DAC. The control lines also serve to control the PROM programming process.

The test system uses the output generated by the DAC 160 as a tuning voltage $V_{tune}$ to maintain the output frequency $F_o$ of the VCXO 152 at a predefined optimum level. As in the case of the microprocessor-based embodiment of the TCO, the TCO system also includes an RF buffer 162 which functions as a high-input impedance link driving the relatively high capacitance 50Ω line to the multiplexing arrangement of the system frequency counter (see FIG. 2). An RF probe 164 having a high impedance is also connected to the VCXO 152 and functions as a high impedance rectifier for converting peak-to-peak VCXO output amplitude to a DC voltage to be supplied, through a multiplexing arrangement, to the system voltmeter 80 (FIG. 2). Power to all components comprising the TCO 150 is provided via a voltage regulator 166 which in turn is supplied with power from the main supply of the test system.

The basic operating sequence followed by the computer-controlled test system in testing and calibrating TCO's as described above with respect to FIG. 2 applies in this case also. However, since the TCO embodiment of FIG. 5 does not include an on-board central processing unit, control over the operation, during the calibration sequence, of the various components constituting the TCO must necessarily be handled by the main computer of the computerized test system. More specifically, the main computer handles the entire sequence of accepting the digitized value from the temperature sensor 156 (FIG. 5), the feeding of trial values to the DAC 160, the measurement of the output frequency of the VCXO for each such trial value and finally the storage of the optimum trial value in the PROM-based look-up table at the address given by the digitized value of the temperature sensor voltage. Furthermore, the computerized test system must be able to override the ADC output to supply the full range of addresses to the PROM for both programming and testing and to override the PROM output, when calibrating with the PROM in-circuit, to supply trial values to the DAC and programming data to the PROM. The ability to override the ADC and PROM outputs is accomplished using the output channels connected to the ADC and PROM control lines. Any addresses skipped during the initial calibration process can be filled by extrapolating from existing data. Once the calibration process is complete, the test system functions merely to test output frequency over the temperature range. The ADC can feed addresses directly to the PROM without intervention and, similarly, the PROM can feed the data addressed by the ADC directly to the DAC without intervention. The measurement of $V_{tune}$ by the test system is not strictly necessary for calibration or testing, but may be useful for device characterization and production tolerance data.

The TCO embodiment of FIG. 5 also entails greater control and involvement of the test system computer in the calibration and test procedure because of the absence of the on-board microprocessor on the TCO. More specifically, the main computer has to exercise control over the sequence of monitoring the output frequency of the VCXO at each of the discrete temperature points, correspondingly adjusting the tuning voltage to the VCXO to maintain a stabilized output frequency even as the temperature varies from one point to another, and storing the digitized value of the optimum compensating tuning voltage for each of the temperature points within the PROM. It will be noted that although the internal circuitry of this type of TCO is simpler than that of the microprocessor version, a serious limitation is placed on the time required for a typical test and calibration cycle because the main computer has to handle the time-consuming frequency monitoring operation for each of the TCO's being processed in a given batch within the test and calibration chamber.

Since the frequency monitoring procedure involves varying the compensating tuning voltage for the VCXO and making repeated frequency measurements upon the VCXO output until the optimum tuning voltage value is determined, a limitation is reached on the maximum rate at which the temperature within the calibration chamber may be ramped and this can significantly increase the batch processing time for such TCO's without on-board microprocessors. In addition, the various auxiliary functions such as self-testing capability and those available by virtue of the serial port on the microprocessor, such as communication with a host computer and remote control over the pre-stored look-up table of tuning voltage values, are not available. However, when used with a host unit having an on-board microprocessor this type of unit serves as an economical and simple means for providing a stabilized frequency reference over an extended temperature range.

A problem associated with piezoelectric crystals, especially those of the commercial non-expensive kind in which the crystal cut is relatively inaccurate, is that towards the extremes of the operating temperature range of the crystals the resonant frequency changes very rapidly even for minor variations in the crystal temperature. In other words, the crystal frequency versus temperature relationship exhibits a sharp slope towards the outer bounds of the operating temperature range of the crystal. This causes a drop in the resolution with which the output voltage of the VCXO is regulated in correspondence to temperature variations detected by the TCO temperature sensor, since the temperature measurement is performed at well-separated points and compensating voltage values are determined and stored only at these pre-defined temperature measurement points. If the crystal frequency undergoes a substantial change in between two consecutive temperature measurement points, a corresponding compensating voltage value is not available and the output frequency of the VCXO deviates from the desired set point value until the fluctuating temperature reaches the next successive temperature measuring point. According to a feature of this invention, the above problem is solved by increasing the resolution of the analog-to-digital converter without increasing the conversion error for the ADC or introducing any nonlinearity.

More specifically, the fluctuating analog output of the temperature transducer is scaled and offset by suitable pre-amplification stages to match the input voltage range of the ADC provided on board the CPU of the TCO. The extent of scaling or gain is fixed; however, the offset is selected by the CPU through one of a plurality of resistors (in this case, four) driven by selected CPU input/output lines in such a way that the temperature transducer output range is split into four overlapping ranges, thereby effectively quadrupling the resolution of the ADC over the linear range of the temperature sensor. A similar approach is followed at the digital-to-analog conversion end of the TCO system in order to provide increased resolution for the output of the R-2R network.

Figure 6:
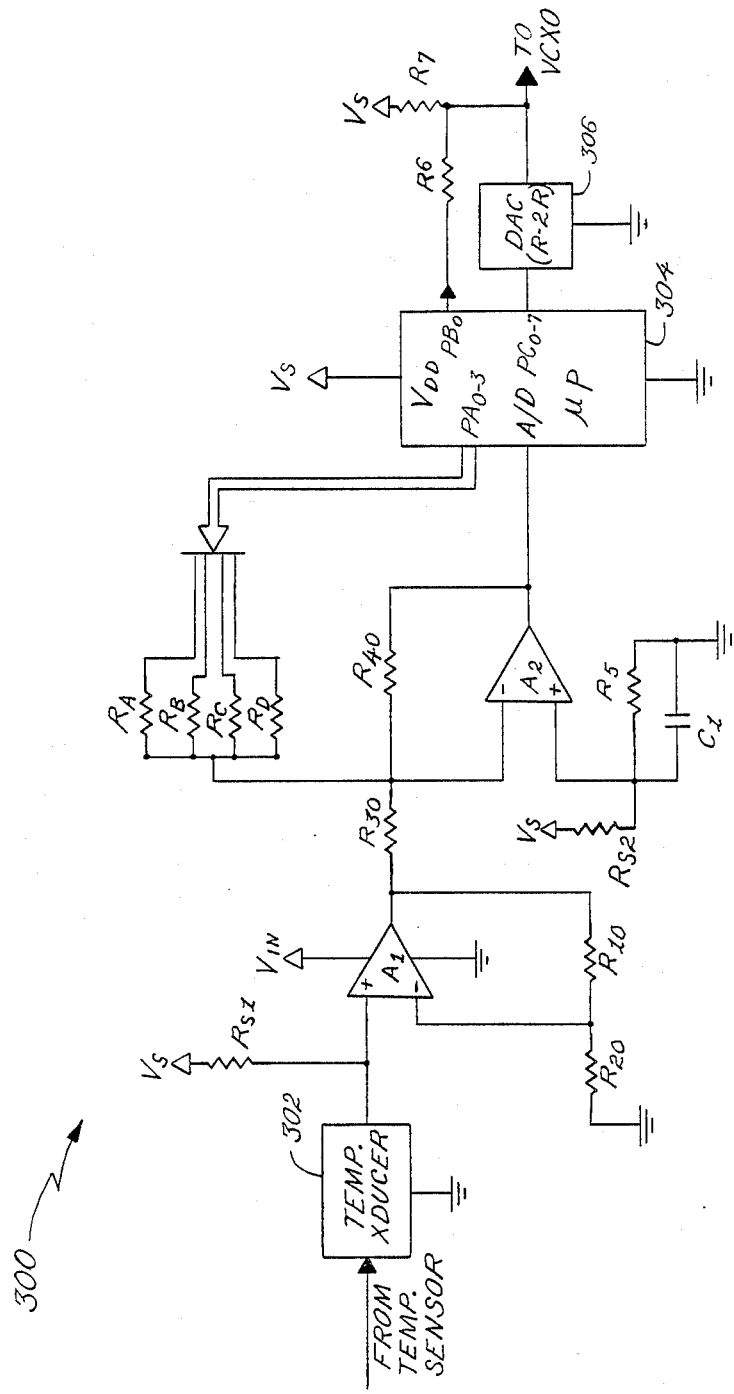
FIG. 6 shows an exemplary arrangement for increasing the resolution of the ADC and DAC stages of the illustrative TCO system.

Referring now to FIG. 6, there is shown an exemplary arrangement 300 for providing increased resolution with relatively decreased conversion error for the output of the ADC and DAC stages of the illustrative TCO system. In FIG. 6, the analog electrical output voltage of the temperature transducer 302 is initially amplified by feeding it to the non-inverting input node of an operational amplifier $A_1$. A negative feedback path through a resistance $R_{10}$ links the output of the amplifier $A_1$ to its negative input node which is also coupled to ground through a resistance $R_{20}$. The temperature transducer's bias current is provided by coupling its positive terminal to a supply voltage $V_s$ through a pull-up resistance $R_{s1}$. The resistance $R_{s1}$ also serves as a load resistance to create the varying voltage drop which becomes the temperature transducer's output voltage, which is then further scaled and offset by the following circuitry. The amplifier $A_1$ functions in a non-inverting mode and provides a pre-determined gain to the analog electrical output of the temperature transducer 302 in order to produce a steeper transfer function for the output voltage of the transducer in relation to the corresponding sensed temperature.

However, the increased gain in combination with the fluctuation in the sensor output as the ambient temperature changes is likely to cause an output which exceeds the permissible range of the analog-to-digital converter provided within the microprocessor 304. This leads to saturation of the ADC output; an unavoidable problem with most on-board ADC's since they do not function as differential amplifiers and consequently possess no adjustable offset facility. In order to avoid this problem, provision is made, according to a feature of this invention, for a plurality of controllably selectable ranges of input for the ADC. More specifically, the output of the amplifier $A_1$ is fed through a resistance $R_{30}$ to the current-summing negative input node of a differential amplifier $A_2$ which is provided with a negative feedback path linking its output back to its current-summing negative input node through a resistance $R_{40}$. The positive input node of the amplifier $A_2$ is provided with a fixed reference voltage by coupling it to the voltage divider formed by resistors $R_{s2}$ and $R_5$ connected between supply voltage $V_s$ and ground. The positive input node is also connected to a noise-filtering capacitor $C_1$, which shunts noise pick-up to ground. The current-summing negative input node of the amplifier $A_2$ is connected to the microprocessor 304 through its input/output port by discrete lines $PA_0$–$PA_3$ each including an attenuating resistance disposed in between the amplifier node and the corresponding output node of the microprocessor IO port.

In the illustrative embodiment of FIG. 6, the negative node of $A_2$ is connected to four separate lines having resistances $R_A$, $R_B$, $R_C$ and $R_D$, respectively. Each of these lines is controlled by the microprocessor to provide a different offset current coupled to the summing node of the amplifier $A_2$ by which the amplified output is scaled and offset before being digitized by the ADC input of the microprocessor. In effect, the resistive lines which include $R_A$, $R_B$, $R_C$ and $R_D$ provide a plurality of ranges over which the input current of the amplifier $A_2$ may be selected to vary on the basis of the incoming input from the temperature transducer. The above arrangement functions by initially using the microprocessor to analyze the output of the amplifier $A_2$ in order to determine if this value exceeds the input limit, i.e., if the ADC output is saturated for a given range, for the ADC. If the output value equals or exceeds the input limit, the microprocessor selects the appropriate offset line in order to generate an offset which shifts the amplifier output down to within the input limits without affecting the overall gain provided by the amplifier.

Once the appropriate offset is selected, the complete linear range of the ADC is again available to translate the analog electrical input into corresponding digital values.

In order to ensure the generation of unique output codes from the ADC that can be used as look-up table addresses, the following operations are adopted. First, on the basis of the number (0-3) of the range selected, two most significant bits are added to the ADC's binary output. For example, if range 0 is selected, then an output code 10110010 is transformed to 0010110010; if range 3 is selected, the same code is transformed to 1110110010. Second, in the temperature region where two adjacent ranges overlap, only one range is allowed to be valid, so that only unique codes will be generated in that region. This is accomplished by allowing only code changes in one direction to go to the ADC limit before changing ranges. Code changes in the other direction are verified as being unique by momentarily switching to the next adjacent range in the direction of the input change and then checking if the ADC generates a code within its limits. If so, then the new range is the valid one and is left activated. These operations ensure that each point in the TCO's temperature range is converted into a unique digital value, which must be done so that only one address is generated as an index into the PROM's look-up table for each temperature point.

The digitized values from the ADC are then used as an address to retrieve the corresponding compensating voltage values stored within the microprocessor-based EEPROM and then convert them into corresponding analog signals by using a digital-to-analog converter 306, as has been described above in detail.

Figure 7:
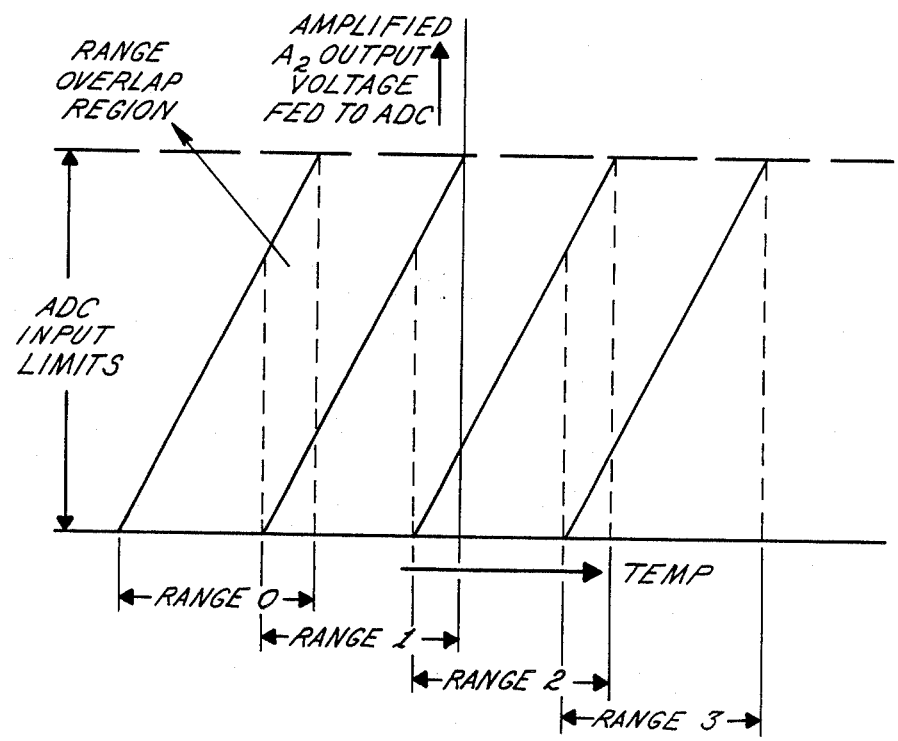
FIG. 7 is a graphical representation of the overlapping ranges resulting from the ADC resolution increase arrangement.

The offset currents fed back to the summing node by the microprocessor are scaled by selecting appropriate values of the resistances $R_A$, $R_B$, $R_C$ and $R_D$, in such a way as to provide the same amplified output range, corresponding to the ADC's input voltage limits without output saturation, for four different input ranges with a slight overlap existing between successive ranges. This is illustrated in FIG. 7 which is a graphical representation of the variation in the amplified output voltage fed to the ADC with respect to temperature and shows the four overlapping ranges 0-3. This precludes the possibility that some quantization levels may be excluded when an offset current causes the amplifier to switch from one range to another.

The output of the DAC, i.e., the R-2R network, is also provided with increased resolution by using a similar approach, i.e., by increasing the number of discrete output levels that can be provided within the linear portion of the tuning voltage range for the varactor provided in the VCO. The output of the R-2R network is connected through a resistance $R_6$ to the microprocessor through one of its IO port lines $PB_0$. A pull-up resistance $R_7$ connects the output of the R-2R network to the supply voltage $V_S$ and limits the output of the DAC 306 to the linear portion of the TCO tuning range. The IO port for the preferably CMOS microprocessor is basically resistive and has a resistivity substantially small in comparison with the resistance R used in the R-2R network so that the error introduced by the IO port itself is insignificant. The output resistance $R_6$ functions to further attenuate the maximum output voltage range of the R-2R network and split it into two slightly overlapping sub-ranges.

The status of the $PB_0$ line (high or low) determines the particular range in which the output of the DAC lies. When the $PB_0$ line driving $R_6$ is high, the resistances $R_6$ and $R_7$ in combination form a pull-up resistance which limits the output voltage range of the R-2R network approximately to the top-half of its maximum output range. When the $PB_0$ line is low, the resistances $R_6$ and $R_7$ form a divider limiting the output voltage range of the R-2R network approximately to the bottom-half of its maximum output range. This effectively doubles the resolution of the DAC. The range splitting is performed in such a way that a slight overlap occurs between the two ranges in order to prevent gaps in possible output voltages when switching from one range to another. The microprocessor monitors either the digital value fed to the DAC or the output of the DAC and each time this value reaches the limits of a prescribed output range, the DAC output is shifted by activating the $PB_0$ line so that the next linear range of the DAC is again available, thereby effectively doubling the available output resolution for the DAC. This arrangement hence substantially increases the resolution of the digitized output fed to the VCO without a corresponding increase in the conversion error.

In the region of overlap between the two DAC ranges, it is unimportant as to which range is chosen for storing the compensating digital value in the PROM look-up table, as long as the same range is used when recreating the compensating analog value by feeding the digital value extracted from the table to the DAC input because repeatability is the prime consideration at this point.

Figure 8:
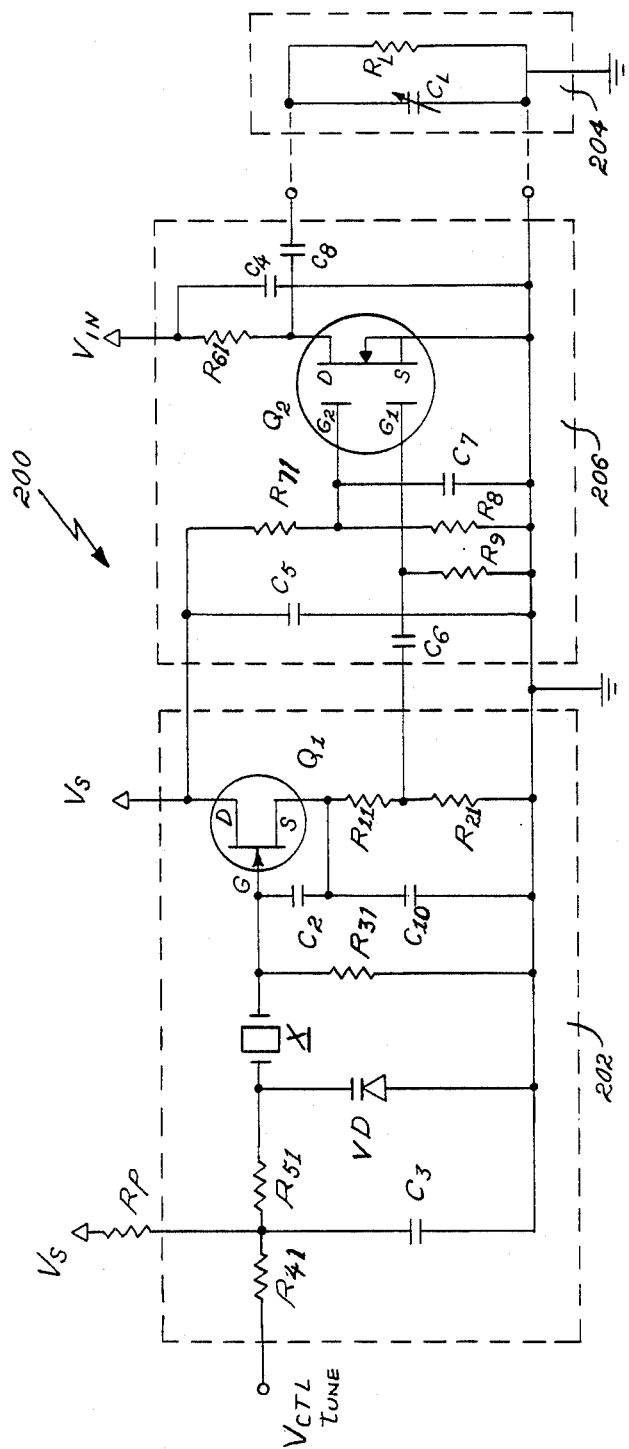
FIG. 8 is a schematic diagram of an exemplary VCXO circuit for use with the TCO system of this invention.

Referring now to FIG. 8, there is shown an exemplary voltage controlled crystal oscillator (VCXO) circuit for use with the TCO system of this invention. The VCXO circuit 200 comprises an oscillation stage 202 which drives a test loading stage 204 or external circuitry through an isolation stage 206. The oscillation stage 202 essentially comprises a conventional crystal-based Colpitts-FET oscillator functioning in the parallel or anti-resonance mode wherein the crystal used in the oscillator circuit serves as a positive reactance. The oscillator itself comprises a junction field-effect-transistor (FET) $Q_1$ along with a tunable resonant circuit which includes a quartz crystal for generating a reference frequency.

The amplifier $Q_1$ is an n-type depletion mode FET and is provided with a supply voltage $V_s$ at its drain D. The source S of the amplifier is coupled to ground through a serial connection of resistances $R_{11}$ and $R_{21}$ with the junction of $R_{11}$ and $R_{21}$ constituting an output extraction point. The gate G of the amplifier $Q_1$ is connected to one end of a crystal unit X and to a parallel circuit consisting of a resistance $R_{31}$ and serially connected capacitors $C_{10}$ and $C_2$. A feedback path is provided from the source S to the gate G through the capacitor $C_2$. A varactor diode VD is connected between ground and the end of the crystal remote from the amplifier gate G.

Since the oscillator circuit operates in the parallel resonance mode, the circuit provides a load capacity to the crystal unit X and the oscillator operates at the frequency where the reactance of the crystal unit cancels the reactance of the load capacitors. The bias voltage to the FET amplifier $Q_1$ is selected in such a way that $Q_1$ functions in its active operating region and provides a voltage gain which substantially exceeds unity. Oscillation of the amplifier $Q_1$ at a prescribed frequency is provided by regenerative feedback through the oscillator circuit reactance which causes the amplifier to be unstable. The frequency of oscillation is dependent upon the combined resistance offered by $R_{11}$ and $R_{21}$ and the capacitance offered into the circuit by the capacitor $C_{10}$ and the capacitance of the varactor VD. This output frequency can be controlled by varying the time constant of the oscillator circuit which can be accomplished by varying the total resistance or the capacitance associated with the resonant circuit. Since a variation in the resistive coupling of the source S of $Q_1$ to ground brings about a corresponding undesirable variation in the drain current of the amplifier $Q_1$, it is more convenient to control the frequency of oscillation by varying the capacitive component of the resonant circuit.

In the illustrative oscillator circuit of FIG. 8, the oscillating frequency is regulated by varying the total amount of capacitance shunting the crystal unit X; a function performed by the varactor diode VD. The capacitance of the varactor is varied by changing the reverse bias voltage applied to it. More specifically, a tuning voltage $V_{tune}$ is applied through a pair of serially connected limiting resistances $R_{41}$ and $R_{51}$ to the cathode end of the varactor diode VD. A pull-up resistance $R_p$ connects the junction of resistances $R_{41}$ and $R_{51}$ to the supply voltage $V_s$ and further limits the tuning voltage $V_{tune}$ to a desired linear range. In the case where the DAC resolution enhancement arrangement of FIG. 6 is used, $R_7$ of FIG. 6 replaces $R_p$ of FIG. 8; however, their functions are similar. A blocking capacitor $C_3$ connects the pull-up resistor to the ground. The above arrangement ensures that the positive tuning voltage $V_{tune}$ is applied to the varactor diode in such a way that any increase or decrease in the tuning voltage $V_{tune}$ causes corresponding increase or decrease in the potential between the cathode and the anode of the varactor diode and hence regulates the effective capacitance shunting the crystal unit X.

It will be noted that, being a parallel resonance circuit, the Colpitts oscillator requires a high shunt-load impedance on the crystal unit and hence the FET amplifier $Q_1$, by virtue of its high input impedance is well suited to this application. In addition, the FET amplifier $Q_1$ exhibits a relatively high output impedance which while limiting both the ability to drive source capacitor $C_1$ and the upper frequency of oscillation, helps to block low output harmonics at higher operating frequencies. However, at frequencies much above 10 MHz, where a high shunt-load impedance on the crystal unit is not as important, a bipolar transistor may be substituted for the FET, particularly in applications requiring a relatively large capacitance at the source lead of the FET amplifier.

The oscillator stage 202 drives a test loading stage 204 comprising a shunt connection of a load resistance $R_L$ and a variable capacitance $C_L$. Efficient coupling of the oscillator stage to the loading stage or external loading circuitry is accomplished through the isolation stage 206 which essentially comprises a dual-gate MOSFET $Q_2$ which provides a low output conductance and is particularly suitable for use at higher frequencies of operation because of its lower feedback capacitance. The MOSFET $Q_2$ is supplied with a voltage $V_{in}$ through a resistance $R_{61}$ at its drain D along with a blocking capacitance $C_4$ connecting the supply point to ground. The supply voltage $V_s$ is connected to the gate $G_2$ of $Q_2$ through a limiting resistance $R_{71}$ along with a blocking capacitance $C_5$ connecting the supply point to ground.

The output of the oscillator stage, extracted at the junction of the source resistances $R_{11}$ and $R_{21}$ of the oscillator amplifier $Q_1$, is supplied through a coupling capacitor $C_6$ to the gate $G_1$ of $Q_2$. The source resistances $R_{11}$ and $R_{21}$ of the amplifier $Q_1$ function as a voltage divider and provide attenuation and isolation of the output of the amplification stage 202. The gate $G_2$ of $Q_2$ is also coupled to ground through a shunt connection of a capacitance $C_7$ and a resistance $R_8$ while the gate $G_1$ is coupled to ground through a resistance $R_9$. The output of the oscillation stage is extracted at the drain D of $Q_2$ and is supplied to the test loading stage or the host radio through a capacitance $C_8$. The MOSFET $Q_2$ functions in such a way that the bias current is substantially self-limiting and by virtue of its high input impedance and relatively low output impedance prevents cross-coupling and undue loading of the amplification stage and the loading stage or external loading circuitry and efficiently isolates them.

What is claimed is:

1. A temperature compensated oscillator (TCO) capable of accurately generating a desired frequency which is stabilized over a selected temperature range, said TCO comprising:

a voltage controlled oscillator (VCO) with a frequency of operation controllable by a tuning voltage $V_c$;

means for sensing the ambient temperature of the VCO and generating a corresponding analog electrical signal;

ADC means for converting said analog signal to a corresponding digital temperature value;

storage means for storing a plurality of digital $V_c$ values corresponding to said digital temperature values for discrete temperature points extending across said temperature range;

means for using said digital temperature values as indices to extract the corresponding digital $V_c$ values from said storage means;

DAC means for converting an extracted digital $V_c$ value into a corresponding analog signal;

means for feeding the analog $V_c$ signal to said VCO in order to maintain said stabilized frequency of operation;

means for responding to a digital temperature value $V_D$ generated by said ADC means which does not have a corresponding stored digital $V_c$ value but is within said selected temperature range, by using stored digital $V_c$ values corresponding to selected ones of said digital temperature values to determine a digital $V_c$ value corresponding to said digital temperature value $V_D$ which may be converted by said DAC means and fed to said VCO; and means for receiving an externally generated signal including a digitized offset value, and means for responding to said external signal by combining said offset value with each of said extracted digital $V_c$ values before the value is converted into a corresponding analog value and fed to said VCO.

2. The TCO of claim 1 wherein said means for using the digital temperature values to extract the digital $V_c$ values is a central processing unit (CPU), and said storage means is a programmable read-only-memory (PROM).

3. The TCO of claim 2 wherein said PROM is based within the CPU.

4. The TCO of claim 1 wherein said VCO is a crystal-based voltage-controlled oscillator.

5. The TCO of claim 2 wherein said ADC and said DAC means is based within the CPU.

6. The TCO of claim 2 wherein said DAC means is in the form of an R-2R network.

7. The TCO of claim 2 wherein each of said stored digital $V_c$ values represents the tuning voltage required to be fed to the VCO at the corresponding sensed temperature in order to maintain its frequency of operation stabilized at the desired value.

8. The TCO of claim 1 further comprising means for multiplying the resolution with which said ADC means convert said analog signal to said corresponding digital value, and means for multiplying the resolution with which said DAC means convert said extracted digital $V_c$ value to said corresponding analog signal.

9. The TCO of claim 2 wherein said PROM is an electrically-erasable PROM (EEPROM).

10. A temperature compensated oscillator (TCO) system capable of accurately generating a desired frequency which is stabilized over a selected temperature range, said TCO system comprising
(a) a TCO comprising a voltage-controlled oscillator (VCO) with a frequency of operation controllable by a tuning voltage $V_c$,
means for sensing the ambient temperature of the VCO and generating a corresponding analog electrical signal,
ADC means for converting said analog signal to a corresponding digital temperature value,
storage means for storing a plurality of digital $V_c$ values corresponding to said digital temperature values for discrete temperature points extending across said temperature range,
processing means for using said digital temperature values as indices to extract the corresponding digital $V_c$ values from said storage means,
DAC means for converting the extracted digital $V_c$ value into a corresponding analog signal,
means for feeding the analog $V_c$ signal to said VCO in order to maintain said stabilized frequency of operation,
means for responding to a digital temperature value $V_D$ generated by said ADC means which does not have a corresponding stored digital $V_c$ value but is within said selected temperature range, by using stored digital $V_c$ values corresponding to selected ones of said digital temperature values to determine a digital $V_c$ value corresponding to said digital temperature value $v_D$ which may be converted by said DAC means and fed to said VCO,
means for receiving an externally generated signal including a digitized offset value, and means for responding to said external signal by combining said offset value with each of said extracted digital $V_c$ values before the value is converted into a corresponding analog value and fed to said VCO; and
(b) a calibration and test circuit (CTC) for the TCO comprising
means for feeding, at each of a series of discrete temperature levels represented by corresponding digital values and extending across said selected temperature range, a plurality of tuning voltages $V_c$ to the VCO,
means for measuring the correspondingly generated output frequencies,
means for comparing each of said measured output frequencies to a reference frequency to determine the frequency difference between them, in order to determine an optimum $V_c$ value which produces a VCO output frequency which differs least from said reference frequency, and
means for storing said optimum voltage values within said storage means of said TCO in a manner allowing them to be subsequently retrieved by using corresponding digital temperature values as indices.

11. The TCO system of claim 10 wherein the VCO within said TCO is a crystal-based voltage-controlled oscillator.

12. The TCO system of claim 10 wherein said processing means and said storage means within the TCO are a central processing unit (CPU) and an electrically-erasable-programmable read-only-memory (EEPROM), respectively.

13. A method for maintaining the output frequency $f_o$ of a voltage controlled oscillator (VCO) stabilized at a desired value over a selected temperature range, including the steps of:
calibrating the VCO by determining at each of a series of discrete temperature levels represented by corresponding digital values and spread over said temperature range, the tuning voltage $V_c$ required to maintain the output frequency of said VCO at said desired value;
digitizing and storing said determined $V_c$ values within the VCO in a manner allowing them to be subsequently retrieved by using the corresponding digital temperature values as indices,
sensing and digitizing the ambient temperature of the VCO during its operation;
using the sensed digital temperature value as an index to retrieve the corresponding stored digital $V_c$ value;
converting the digital $V_c$ value to its corresponding analog voltage form;
feeding the analog tuning voltage to the VCO in order to maintain its output frequency at the desired value;
sensing when a digitized ambient temperature value lies within said temperature range but does not correspond to any of said stored $V_c$ values and in response thereto using stored digital $V_c$ values corresponding to selected ones of said digital temperature values to determine a digital $V_c$ value corresponding to said digitized ambient temperature value, and using said determined $V_c$ value to maintain the output frequency of the VCO at the desired value; and
sensing from a location remote to said VCO, when the output frequency of the VCO at different ambient temperatures shifts by a predetermined value from said desired frequency value and in response thereto calculating and transmitting to the VCO an offset value which when added to each of the stored digital $V_c$ values before it is converted to corresponding analog form and fed to the VCO produces a predetermined shift in the VCO output frequency.

14. The method of claim 13 wherein the VCO is a crystal-based voltage-controlled oscillator and the tuning voltage values are stored in a programmable-read-only-memory (PROM) and the storage and retrieval is performed through a central processing unit.

15. The method of claim 13 wherein the tuning voltage values are stored in an electrically-erasable-programmable read-only-memory (EEPROM).

16. A method for maintaining the output frequency $f_o$ of a voltage controlled oscillator (VCO) stabilized at a desired value over a selected temperature range, including the steps of:

- calibrating the VCO by determining at each of a series of discrete temperature levels represented by corresponding digital values and spread over said temperature range, the tuning voltage $V_c$ required to maintain the output frequency of said VCO at said desired value;
- digitizing and storing said determined $V_c$ values within the VCO in a manner allowing them to be subsequently retrieved by using the corresponding digital temperature values as indices,
- sensing and digitizing the ambient temperature of the VCO during its operation;
- using the sensed digital temperature value as an index to retrieve the corresponding stored digital $V_c$ value;
- converting the digital $V_c$ value to its corresponding analog voltage form;
- feeding the analog tuning voltage to the VCO in order to maintain its output frequency at the desired value; and
- sensing from a location remote to said VCO, when the output frequency of the VCO at different ambient temperatures shifts by a predetermined value from said desired frequency value and in response thereto calculating and transmitting to the VCO an offset value which when added to each of the stored digital $V_c$ values before it is converted to corresponding analog form and fed to the VCO produces a predetermined shift in the VCO output frequency.

* * * * *